(12) United States Patent
Waidhas et al.

(10) Patent No.: US 10,727,197 B2
(45) Date of Patent: Jul. 28, 2020

(54) EMBEDDED-BRIDGE SUBSTRATE CONNECTORS AND METHODS OF ASSEMBLING SAME

(71) Applicant: Intel IP Corporation, Santa Clara, CA (US)

(72) Inventors: Bernd Waidhas, Pettendorf (DE);
Georg Seidemann, Landshut (DE);
Andreas Wolter, Regensburg (DE);
Thomas Wagner, Regelsbach (DE);
Stephan Stoeckl, Schwandorf (DE);
Laurent Millou, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 1 day.

(21) Appl. No.: 15/464,920

(22) Filed: Mar. 21, 2017

(65) Prior Publication Data
US 2018/0277512 A1    Sep. 27, 2018

(51) Int. Cl.
*H01L 25/065* (2006.01)
*H01L 23/538* (2006.01)
(Continued)

(52) U.S. Cl.
CPC ........ *H01L 25/0652* (2013.01); *H01L 21/561* (2013.01); *H01L 21/568* (2013.01); *H01L 21/6835* (2013.01); *H01L 23/49816* (2013.01); *H01L 23/5381* (2013.01); *H01L 23/5385* (2013.01); *H01L 23/5386* (2013.01); *H01L 24/16* (2013.01); *H01L 24/27* (2013.01); *H01L 24/32* (2013.01); *H01L 24/73* (2013.01); *H01L 24/96* (2013.01); *H01L 25/50* (2013.01); *H01L 24/81* (2013.01); *H01L 24/95* (2013.01); *H01L 2221/68359* (2013.01); *H01L 2224/16148* (2013.01); *H01L 2224/16238* (2013.01); *H01L 2224/16245* (2013.01);
(Continued)

(58) Field of Classification Search
CPC .............. H01L 25/0652; H01L 25/105; H01L 23/5389; H01L 23/49575; H01L 2224/14; H01L 2224/141; H01L 2224/1412; H01L 2224/1413; H01L 2224/14131; H01L 25/115; H01L 25/117; H01L 25/071; H01L 25/112; H01L 25/042; H01L 25/0655; H01L 25/072; H01L 25/0753; H01L 25/043; H01L 25/0657; H01L 25/074; H01L 25/0756
See application file for complete search history.

(56) References Cited

U.S. PATENT DOCUMENTS

5,971,734 A *   10/1999   Moon ............... B29C 45/14655
                                                      264/272.17
2012/0235162 A1*  9/2012  Isobe .................... H01L 23/467
                                                      257/77
(Continued)

*Primary Examiner* — Monica D Harrison
*Assistant Examiner* — John Lin
(74) *Attorney, Agent, or Firm* — Schwabe, Williamson & Wyatt, P.C.

(57) ABSTRACT

An embedded-bridge substrate connector apparatus includes a patterned reference layer to which a first module and a subsequent module are aligned and the two modules are mated at the patterned reference layer. At least one module includes a silicon bridge connector that bridges to two devices, through the patterned reference layer, to the mated module.

23 Claims, 8 Drawing Sheets

(51) Int. Cl.
*H01L 23/498* (2006.01)
*H01L 23/00* (2006.01)
*H01L 21/56* (2006.01)
*H01L 25/00* (2006.01)
*H01L 21/683* (2006.01)

(52) U.S. Cl.
CPC ............... *H01L 2224/16268* (2013.01); *H01L 2224/2711* (2013.01); *H01L 2224/27334* (2013.01); *H01L 2224/29147* (2013.01); *H01L 2224/32148* (2013.01); *H01L 2224/32238* (2013.01); *H01L 2224/32268* (2013.01); *H01L 2224/73203* (2013.01); *H01L 2224/73253* (2013.01); *H01L 2224/81001* (2013.01); *H01L 2224/81447* (2013.01); *H01L 2224/95001* (2013.01); *H01L 2924/00014* (2013.01); *H01L 2924/1433* (2013.01); *H01L 2924/1436* (2013.01); *H01L 2924/181* (2013.01)

(56) References Cited

U.S. PATENT DOCUMENTS

| | | | |
|---|---|---|---|
| 2016/0071818 A1* | 3/2016 | Wang | H01L 25/0655 257/774 |
| 2016/0260686 A1* | 9/2016 | Kimura | H01L 21/6835 |

* cited by examiner

EMBEDDED-BRIDGE SUBSTRATE CONNECTORS AND METHODS OF ASSEMBLING SAME

FIELD

This disclosure relates to embedded-bridge technology for making system-in-package connections.

BACKGROUND

Package miniaturization creates tension between achieving smaller size while achieving increased connection requirements.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIGS. 1I and 1J are omitted;

FIG. 1XZ is a detail section taken from FIG. 1 according to an embodiment;

DETAILED DESCRIPTION

Disclosed embodiments include self-aligned of devices during assembly of an embedded-bridge connector apparatus for a system-in-package apparatus. Embodiments allow a face-to-face die stacking in a bridging configuration of packaged dice. In an embodiment, each die of a second layer can be face-to-face connected to at least one die in a first layer of the die package. The layers may be referred to as modules. The face-to-face connection is also achieved in fine-pitch applications due to the self-alignment of the package-assembly process embodiments that uses a reference layer to which each module is mated. Providing a reference layer during assembly improves X-Y tolerances. Providing a reference layer also improves Z-tolerances as the bridging configuration overlaps structures that might otherwise need to be multiply stacked.

Figure 1:
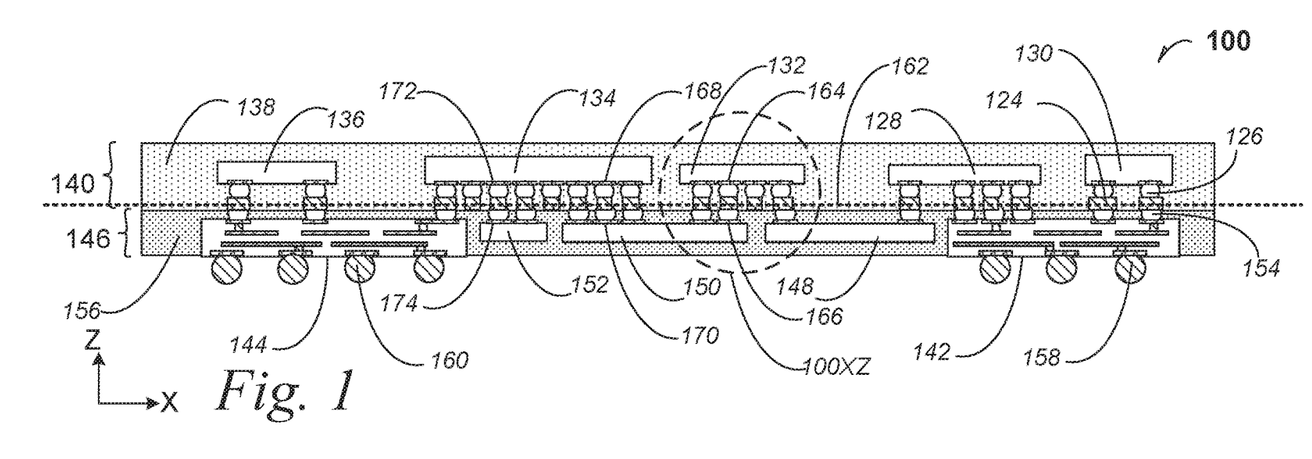
FIG. 1 is a cross-section elevation of the apparatus depicted in FIG. 1K after further processing according to an embodiment.
Figure 1A:
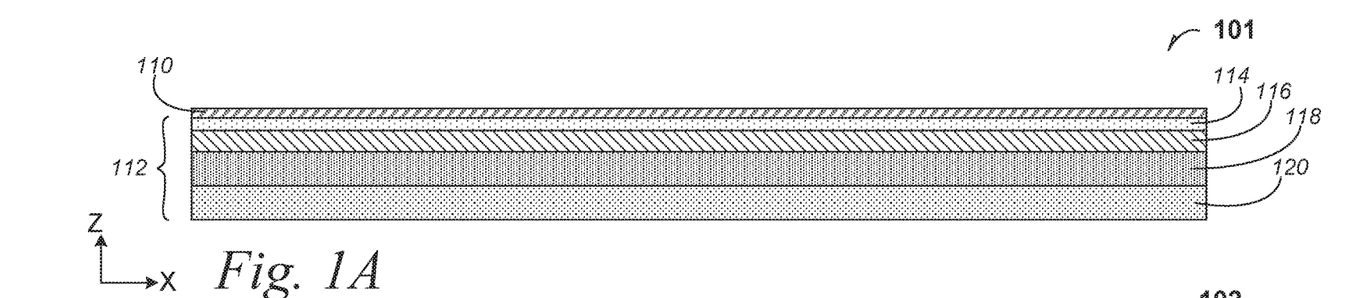
FIG. 1A is a cross-section elevation of an embedded-bridge connector in a system-in-package apparatus according to an embodiment.

FIG. 1A is a cross-section elevation of an embedded-bridge connector in a system-in-package apparatus 101 according to an embodiment. A conductive foil 110 is assembled to a carrier 112 in preparation for patterning a reference layer. In an embodiment, the carrier 112 includes a release layer 114, a thick copper carrier foil 116, a prepreg layer 118, and a core material 120 such as is used for printed circuit board assembly. In an embodiment, the conductive foil 110 is a copper material.

Figure 1B:
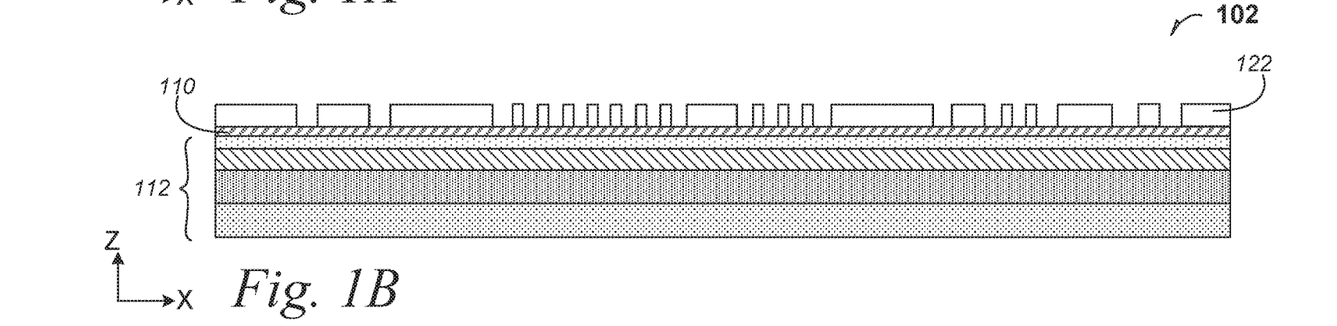
FIG. 1B is a cross-section elevation of the apparatus depicted in FIG. 1A after further processing according to an embodiment.

FIG. 1B is a cross-section elevation 102 of the apparatus 101 depicted in FIG. 1A after further processing according to an embodiment. A patterned mask 122, such as is used for a plating photoresist, is disposed on the conductive foil 110 above the carrier 112. The patterned mask 112 may be processed such as by spinning on a photoresist, planarizing, and patterning to open corridors to the conductive foil 110.

Figure 1C:
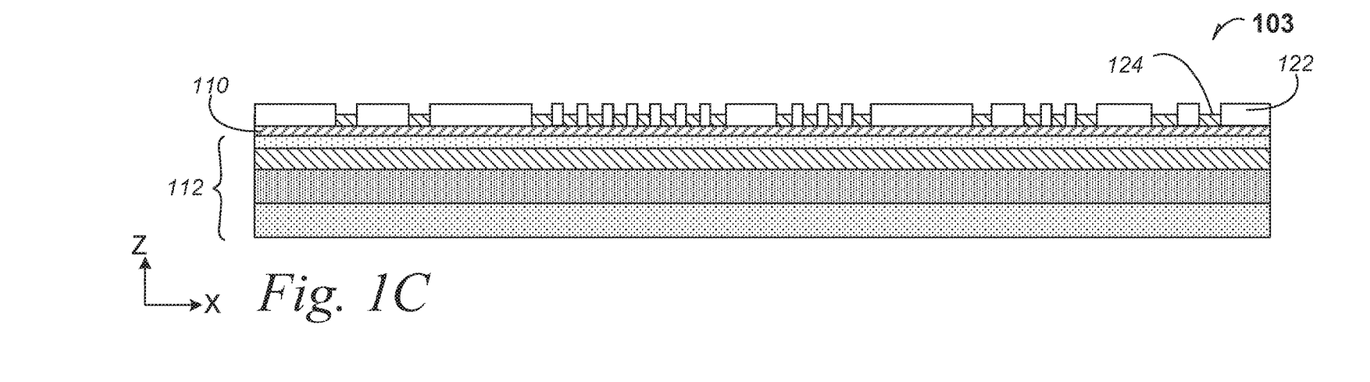
FIG. 1C is a cross-section elevation of the apparatus depicted in FIG. 1B after further processing according to an embodiment.

FIG. 1C is a cross-section elevation 103 of the apparatus 102 depicted in FIG. 1B after further processing according to an embodiment. A reference layer 124 has been plated into the several corridors through the patterned mask 122 by using the conductive foil 110 as a plating cathode. In an embodiment, the reference layer 124 is a copper material that has been plated by electroplating. In an embodiment, the reference layer 124 is a copper material that has been plated by electroless plating. The reference layer 124 is a discrete set of electrically conductive materials, but it is referred to as "reference layer" 124 as a symmetry of build (or an asymmetry) can be determined from the reference layer 124.

Figure 1D:
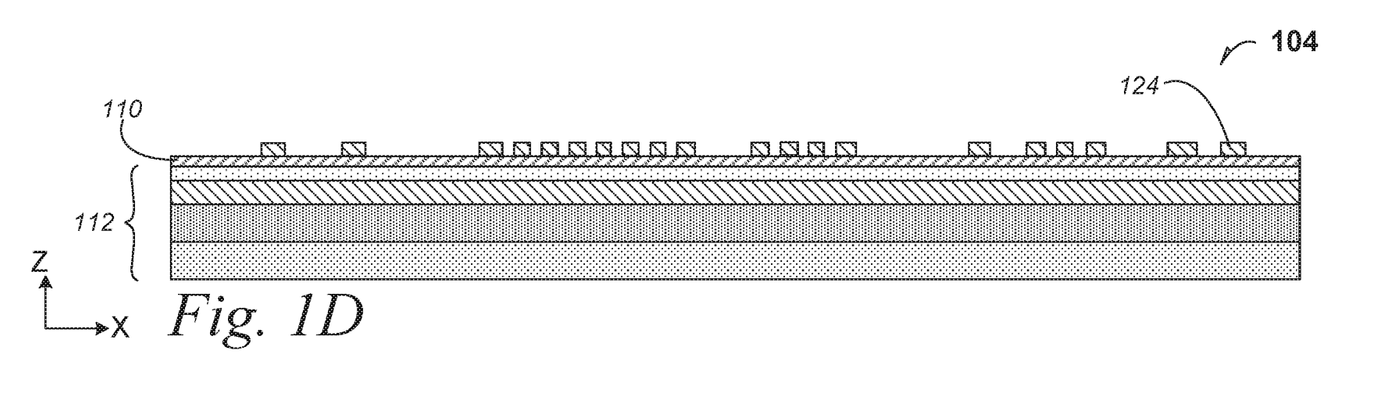
FIG. 1D is a cross-section elevation of the apparatus depicted in FIG. 1C after further processing according to an embodiment.

FIG. 1D is a cross-section elevation 104 of the apparatus 103 depicted in FIG. 1C after further processing according to an embodiment. In an embodiment, the patterned mask 122 (see FIG. 1C) has been removed by wet etching that uses a wet-etch chemistry that is selective to leaving the reference layer 124 and the conductive foil 110. In an embodiment, the patterned mask 122 has been removed by a plasma ash process. It can now be seen that the reference layer 124 is a discrete set of conductive materials that occupy substantially the same Z-directional space. Hereinafter, the reference layer 124 may be referred to also as the patterned reference layer 124, but in any event, it is represented as a discrete series of conductive materials that occupy the same Z-directional space.

Figure 1E:
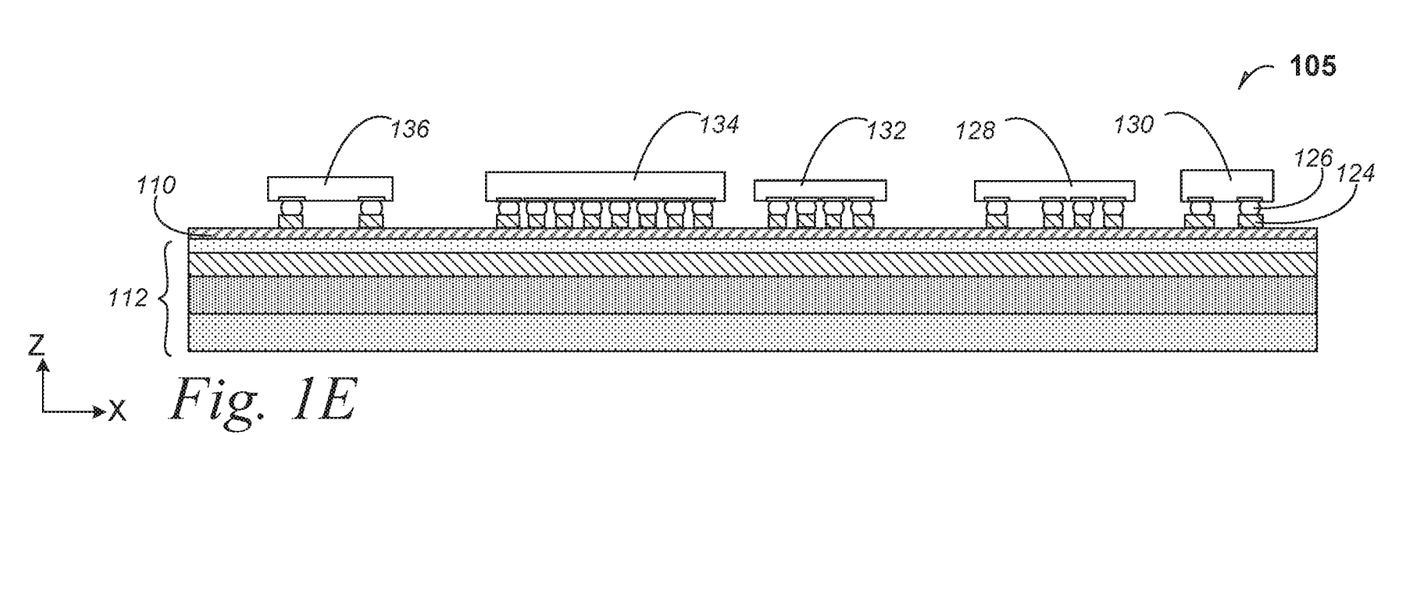
FIG. 1E is a cross-section elevation of the apparatus depicted in FIG. 1D after further processing according to an embodiment.

FIG. 1E is a cross-section elevation 105 of the apparatus 104 depicted in FIG. 1D after further processing according to an embodiment. A series of devices has been assembled to the patterned reference layer 124. It can be seen that a first ball-grid array has been assembled to the patterned reference layer 124, one ball of which is indicated with reference numeral 126. It is seen each ball in the first ball-grid array 126 appears at substantially the same elevation in the Z-direction above the carrier 112 as determined by assembling the first ball-grid array 126 on the reference layer 124. In an embodiment as illustrated in FIG. 1D, it can be seen that the first ball-grid array 126 has a unique pattern that is not necessarily geometrically symmetrical across the apparatus 105, but that it is patterned to connect with a variety of devices.

A variety of devices is assembled on the first ball-grid array 126. In an embodiment, each of the devices is different in Z-height.

In an embodiment, a first device 128 such as a base-band processor 128 is accompanied by second device 130. In an embodiment, the second device 130 is an integrated passive device 130 such as a balun 130, and it is assembled side-by-side with the first device 128 upon the patterned reference layer 124. In an embodiment, the first device 128, although it has an intrinsic semiconductive-device application, also has semiconductive bridge circuitry. Hereinafter, although a device may have both an intrinsic semiconductive-device application where designated, and it is used as a semiconductive bridge, it will be referred to as having "silicon-bridge" function although other semiconductive materials (e.g. III-V materials) may be used to achieve a semiconductive bridge.

In an embodiment, a third device 132 has silicon-bridge functionality, but it also carries useful semiconductive functionality such as for a memory die 132. Where only the first device 128 and the third device 132 are present, the third device 132 may be referred to as a device 132 that is adjacent the first device 128.

In an embodiment, a fourth device 134 has both silicon-bridge functionality and semiconductive logic functionality such as a processor 134. In an embodiment, a subsequent device 136 is provided, and although is does not have silicon-bridge functionality (see FIG. 1H), it has useful semiconductive functionality such as for a storage memory die 136.

Figure 1F:
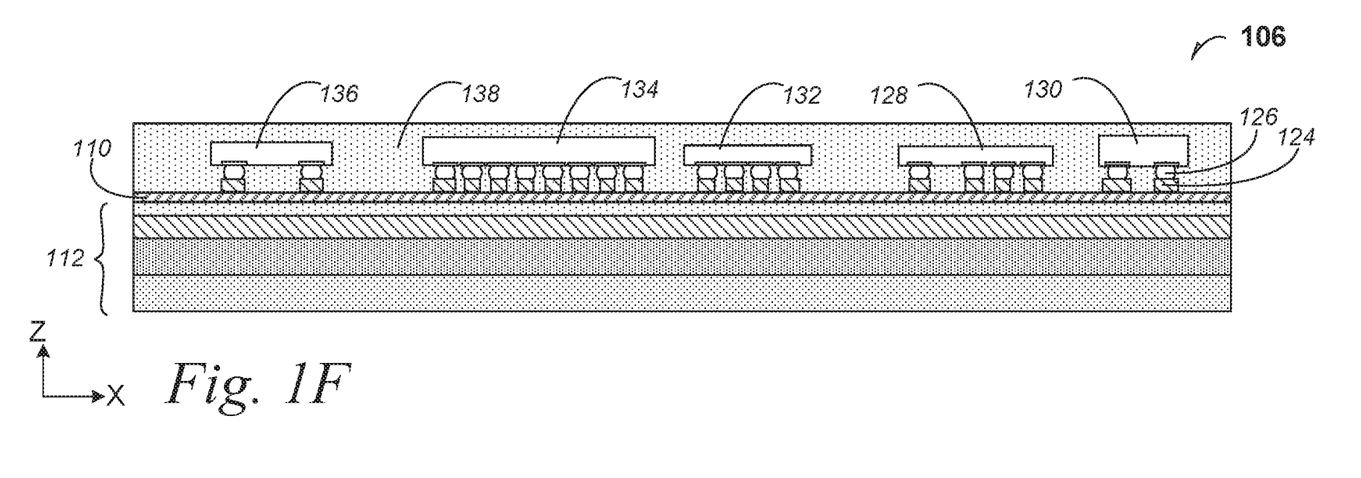
FIG. 1F is a cross-section elevation of the apparatus depicted in FIG. 1E after further processing according to an embodiment.

FIG. 1F is a cross-section elevation of 106 of the apparatus 105 depicted in FIG. 1E after further processing according to an embodiment. A molding compound 138 has been flowed over the several devices 128, 130, 132, 134 and 136, and flowing has included underfilling at the patterned reference layer 124 and the ball-grid array 126 according to an embodiment. After underfilling and capping the molding compound 138 under- and above the several devices, processing includes planarizing and trimming the molding compound 138 according to an embodiment. In an embodiment, the molding compound 138 is referred to as a die-side encapsulation 138.

Figure 1G:
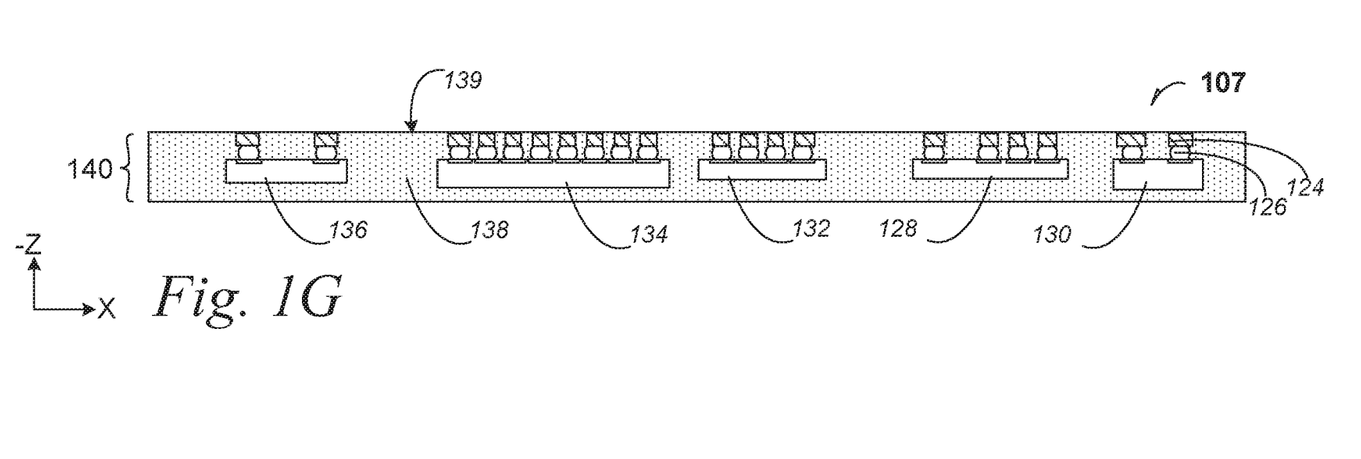
FIG. 1G is a cross-section elevation of the apparatus depicted in FIG. 1F after further processing according to an embodiment.

FIG. 1G is a cross-section elevation of 107 of the apparatus 106 depicted in FIG. 1F after further processing according to an embodiment. The apparatus 107 is depicted in positive-X and negative-Z coordinates as the apparatus 107 has been inverted (compare with FIG. 1F) for further processing. The release layer 114, depicted in FIG. 1A, has been activated such that the carrier 112 has been removed. Additionally in an embodiment, the conductive foil 110 has also been removed by a polishing process that is selective to stopping at a surface 139 where each portion of the patterned reference layer 124 has been exposed through and encapsulated by the die-side encapsulation 138. Other removal techniques may be used. The encapsulated devices that are disposed in the molding compound 138 may be referred to as a die-side module 140 according to an embodiment.

Figure 1H:
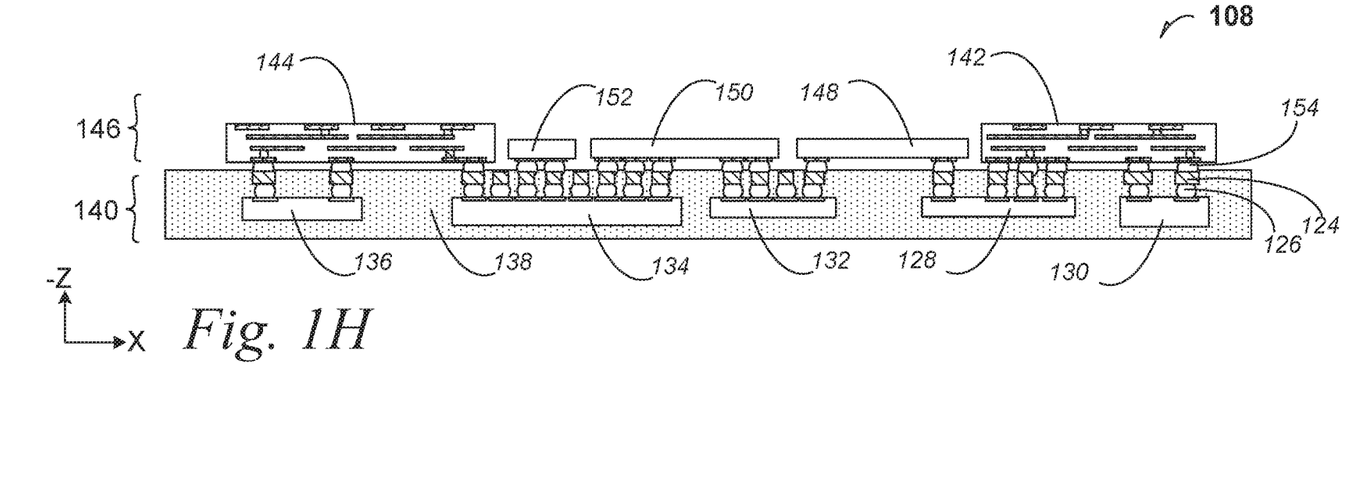
FIG. 1H is a cross-section elevation of the apparatus depicted in FIG. 1G after further processing according to an embodiment.

FIG. 1H is a cross-section elevation of 108 of the apparatus 107 depicted in FIG. 1G after further processing according to an embodiment. The apparatus 108 is also depicted in positive-X and negative-Z coordinates.

Devices embedded in the die-side module 140 have been contacted through the reference layer 124 in a self-aligning technique according to an embodiment. In an embodiment, a first printed wiring board (PWB) 142 is disposed in contact with at least one device. In the illustrated embodiment, the first PWB 142 contacts the first device 128 and the second device 130. In an embodiment, a subsequent PWB 144 is in contact with at least one device. In the illustrated embodiment, the subsequent PWB 144 is in contact with the fourth device 134 and the subsequent device 136. In an embodiment, the first PWB 142 and the subsequent PWB 144 are a single structure such as a "picture frame" rectangle when the apparatus 108 is observed in plan view. The picture frame designation may also be referred to as an open-frame where the first PWB 142 and the subsequent PWB 144 are integral parts of the open-frame structure.

Silicon bridging is accomplished between devices in the die-side module 140 and devices that are disposed in about the same Z-coordinate region that is taken up by the first- and subsequent PWBs 142 and 144. This region is indicated with reference numeral 146 as a land-side module 146.

In an embodiment, a first land-side device 148 contacts the reference layer 124 and acts as a silicon bridge 148 between the first device 128 and the third device 132. In an embodiment beside providing silicon-bridge functionality, the first land-side device 148 also provides intrinsic logic functionality such as a memory controller.

In an embodiment, a second land-side device 150 contacts the reference layer 124 and acts as a silicon bridge 150 between the third device 132 and the fourth device 134. In an embodiment beside providing silicon-bridge functionality, the second land-side device 150 also provides intrinsic logic functionality such as an application-specific integrated circuit (ASIC).

In an embodiment, a subsequent land-side device 152 contacts the reference layer 124 and communicates directly through the reference layer 124 to the fourth device 134 in the die-side module 140. It can be seen that the fourth device 134 in the die-side module overlaps the subsequent land-side device 152, and the fourth device 134 also acts as a silicon bridge, which bridges both between the second land-side device 150 and the subsequent PWB 144 as well as bridges between the second land-side device 150 and the subsequent land-side device 152.

Each land-side device is coupled to the patterned reference layer 124 through electrical bumps in a second ball-grid array, one bump of which is indicated with reference numeral 154.

Figure 1K:
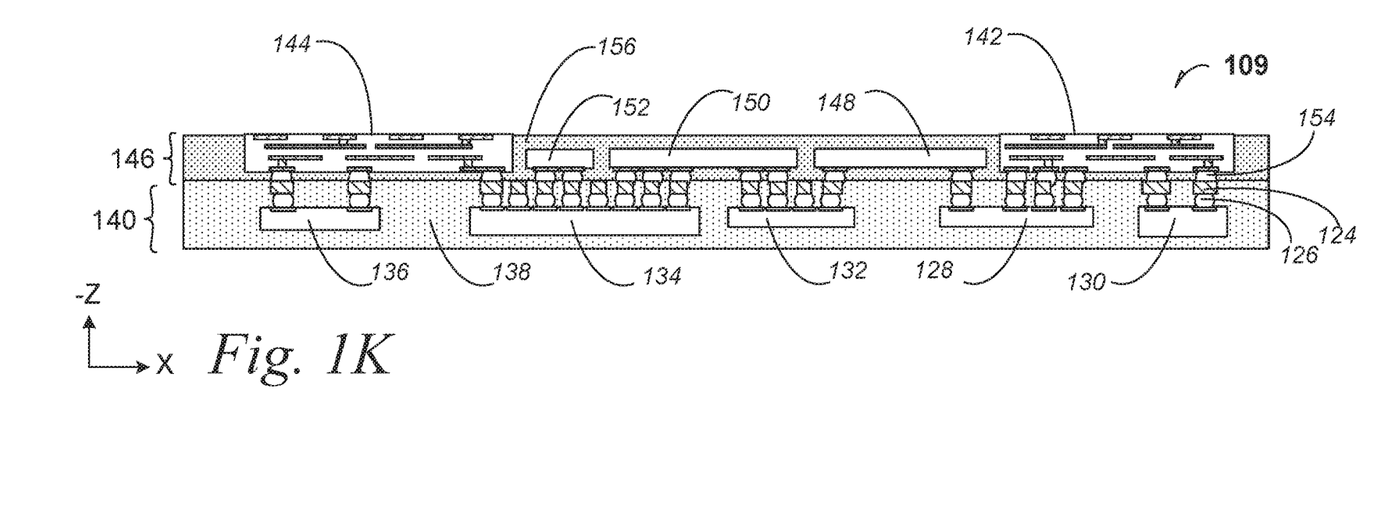
FIG. 1K is a cross-section 109 of the apparatus depicted in FIG. 1H after further processing according to an embodiment.

FIG. 1K is a cross-section elevation 109 of the apparatus 108 depicted in FIG. 1H after further processing according to an embodiment. FIGS. 1I and 1J are omitted. The apparatus 109 is also depicted in positive-X and negative-Z coordinates. Further processing has been done where a land-side encapsulation 156 has been flowed against the die-side encapsulation 138. It can be seen that the land-side module 146 includes- and is essentially enclosed within the land-side encapsulation 156.

FIG. 1 is a cross-section elevation 100 of the apparatus 109 depicted in FIG. 1K after further processing according to an embodiment. The apparatus 100 has been inverted with respect to FIG. 1K to illustrate both positive-X and positive-Z coordinates. The die-side module 140 is mated to the land-side module 146 by self-aligning through the reference layer 124.

Land-side ball arrays are disposed against the first PWB 142 and the subsequent PWB 144. As can be seen, the land-side module 146 is bumped with a land-side ball array, one ball of which is indicated with reference numeral 158 at the first PWB 142. Similarly, a land-side ball array is bumped on the subsequent PWB 144, one ball of which is indicated with reference numeral 160. Where the respective first and subsequent PWBs 142 and 144 are unitary such as a picture frame PWB, the land-side ball arrays 158 and 160 are part of the same land-side ball array.

Figure 2:
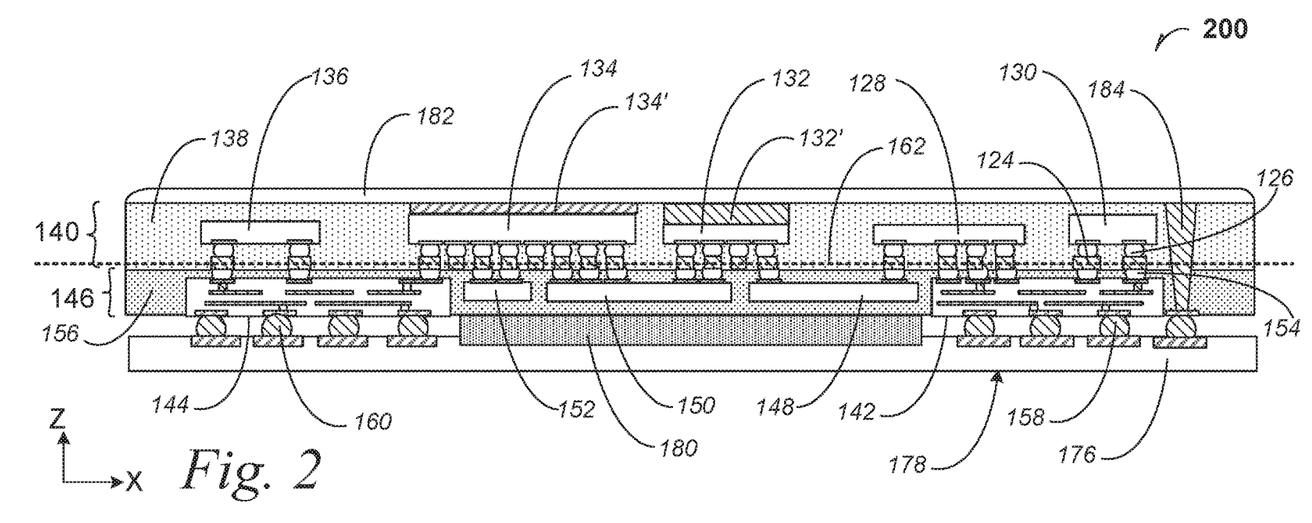
FIG. 2 is a cross-section elevation of an embedded-bridge substrate apparatus according to an embodiment.

It can now be understood that an "embedded bridge" is defined as a semiconductive structure that not only provides physical-contact communication between two other semiconductive devices, but the embedded bridge is touched on at least three surfaces by an embedding material such as the molding compound 138. Hence in FIG. 1, three embedded-bridge instances are found in first device 128, the third device 132, the fourth device 134 and the subsequent device 136. Thus as also can be seen in FIG. 2, although the third and fourth devices 132 and 134, respectively, are backed by structures 132' and 134', respectively, these devices still are each touched by the molding compound 138 on three surfaces.

FIG. 1XZ is a detail section XZ taken from FIG. 1 according to an embodiment. An uniform asymmetrical ratio exists when measuring comparative distances, beginning at the center of the reference layer 124. Using a symmetry line 162 that bisects the reference layer 124, a die-side distance 124E is taken from the symmetry line 162 to a bond pad 164 in the die-side module 140. Similarly using the symmetry line 162, a land-side distance 124A is taken from the symmetry line 162 to a bond pad 166 in the land-side module 146.

It can now be understood that a uniform asymmetry ratio exists in the Z-direction across the symmetry line 162. The uniform asymmetry ratio is between any given device in the die-side module 140 that is face-to-face and that couples with a land-side device in the land-side module 146. This uniform asymmetry ratio exists in an embodiment where bumping sizes may be different within the respective modules. Measurement of the various distances 124E and 124A begin at the symmetry line 162 and end at the respective bond pads where the bond pads 164 and 166 are face-to-face.

Devices of varying thicknesses may be arrayed in the die-side module 140. Similarly, devices and PWBs of varying thicknesses may be arrayed in the land-side module 146. Regardless of varying thicknesses of devices and PWBs, a uniform asymmetry ratio exists between any two devices that are vertically proximate and overlapping (face-to-face) across the symmetry line 162 "Vertically proximate and overlapping" means at least part of two devices are face-to-face and electrically coupled through the reference layer 124. The uniform asymmetry ratio is a comparative distance between any active surface of a device in the die-side module 140 and an active surface of a land-side device that is face-to-face in the land-side module 146.

For example, the third device 132 is disposed vertically proximate (face-to-face) to the second land-side device 150, and where their active surfaces overlap (in the X-direction), there is a die-side distance 124E from the symmetry line 162 to the active surface of the third device 132 (illustrated at the bond pad 164), and there is a land-side distance 124A from the symmetry line 162 to the active surface of the second land-side device 150 (illustrated at the bond pad 166). These two distances provide a measurable ratio within the parameters of assembling an apparatus with packaged devices and optionally with packaged PWBs. These parameters include fiduciary tolerances in both the X-Y dimensions and in the Z-dimension.

Reference is again made to FIG. 1. To further illustrate the uniform asymmetry ratio, the fourth device 134 is also disposed vertically proximate (face-to-face) from the second land-side device 150, and where their active surfaces overlap (in the X-direction), there is a die-side distance from the symmetry line 162 to the active surface of the third device 132 (illustrated at a bond pad 168) and there is a land-side distance from the symmetry line 162 to the active surface of the second land-side device 150 (illustrated at bond pad 170). These two distances also provide a measurable ratio. And the uniform asymmetry ratio can be understood that the ratio of distances from the symmetry line 162, between the bond pads 164 and 166 is the same as the ratio of distances from the symmetry line 162, between the bond pads 168 and 170.

To further illustrate, the fourth device 134 is also disposed vertically proximate (face-to-face) to the third land-side device 152, and where their active surfaces overlap (in the X-direction), there is a die-side distance from the symmetry line 162 to the active surface of the fourth device 134 (illustrated at a bond pad 172) and a land-side distance from the symmetry line 162 to the active surface of the third land-side device 152 (illustrated at a bond pad 174). This means the ratio of distances from the symmetry line 162, between the bond pads 164 and 166 is the same as the ratio of distances from the symmetry line 162, between the bond pads 172 and 174. Likewise, this means the ratio of distances between the bond pads 168 and 170 is the same as the ratio of distances between the bond pads 172 and 174.

Reference is again made to FIG. 1XZ. The term "uniformly asymmetrical" can now be understood by the definition of the ratio of distances as disclosed. To illustrate, the distance from the symmetry line 162 to the bond pad 164 (die-side distance 124E) may be defined as unity, and the distance from the symmetry line 162 to the bond pad 166 (land-side distance 124A) may be defined as twice unity. Consequently, the ratio of distances is 0.5:1 and this uniform asymmetry will be measured between any two devices that are vertically proximate (face-to-face) in the Z-direction and overlapping in the X-direction.

Reference is again made to FIG. 1. To further illustrate, the distance from the symmetry line 162 to the bond pad 172 by definition is unity (as it is the same distance from the symmetry line 162 to the bond pad 164), and the distance from the symmetry line 162 to the bond pad 174 is measured as twice unity (as it is the same distance from the symmetry line 162 to the bond pad 166). Consequently, the ratio of distances is also 0.5:1.

FIG. 2 is a cross-section elevation of an embedded-bridge substrate apparatus 200 according to an embodiment. The land side ball arrays 158 and 160 contact a board 176 such as a motherboard 176. In an embodiment, the board 176 has an outer surface 178 that acts as an outer shell 178 for a computing device.

In an embodiment, the die-side module 140 and the land-side module 146 include the board 178 and a power source 180. In an embodiment, the power source 180 fits between the land-side module 146 and the board 176. In an embodiment, the power source 180 fits between the land-side module 146 and the board 176, but it is partially recessed in the board 176 (as illustrated). In an embodiment, the power source 180 fits between the land-side module 146 and the board 176, but it is partially recessed in in the land-side encapsulation 156. In an embodiment, the power source 180 fits between the land-side module 146 and the board 176, but it is partially recessed in the board 176 (as illustrated), and it is also partially recessed in in the land-side encapsulation 156.

In an embodiment, a user interface 182 is disposed on the top of the die-side module 140. In an embodiment, the user interface 182 is a touch-sensitive display 182. Coupling of the user interface 182 to power may be done by a through-mold via 184 that contacts the board 176.

In an embodiment, heat management is assisted by, e.g., a heat-generating device such as when the fourth device 134 is a processor, where a heat sink 134' backs the fourth device 134, and a portion of the structure 182 acts as a heat exhauster. Similarly in an embodiment, heat management for e.g. a device 132 such as memory-controller hub 132, is assisted by a heat sink 132' that backs the third device 132 and a portion of the structure 182 acts as a heat spreader.

Figure 3:
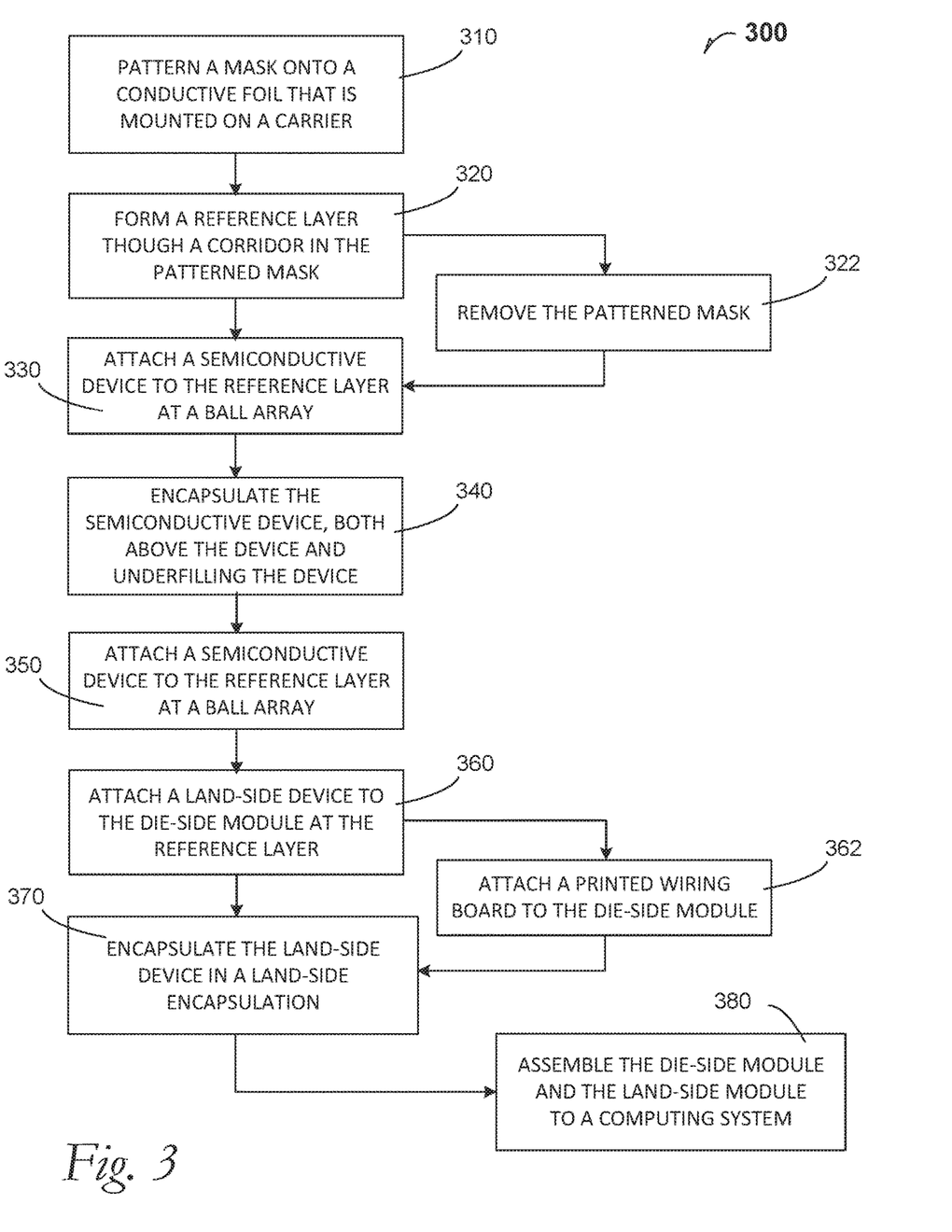
FIG. 3 is a process flow diagram that illustrates assembly of an embedded-bridge substrate connector apparatus according to an embodiment.

FIG. 3 is a process flow diagram 300 that illustrates assembly of an embedded-bridge substrate connector apparatus according to an embodiment.

At 310, the process includes patterning a mask on a conductive film that is supported by a carrier.

At 320, the process includes forming a reference layer through a corridor in the patterned mask. The conductive film is used as a cathode to plate the reference layer.

At 322, the process includes removing the patterned mask. In an embodiment, the mask may be retained as a solder-bump template.

At 330, the process includes attaching a semiconductive device to the reference layer at ball array.

At 340, the process includes encapsulating the semiconductive device, both above the device and underfilling the device.

At 350, the process includes removing the carrier and the conductive foil. Removal of the carrier and foil result in the die-side module.

At 360, the process includes attaching a land-side device to the die-side module through the patterned reference layer.

At 362, the process includes attaching at least one printed wiring board to the die-side module.

At 370, the process includes encapsulating the land-side device and the printed wiring board, if present, in a land-side encapsulation.

At 380, the process includes assembling the land-side module and the die-side module to a computing system.

Figure 4:
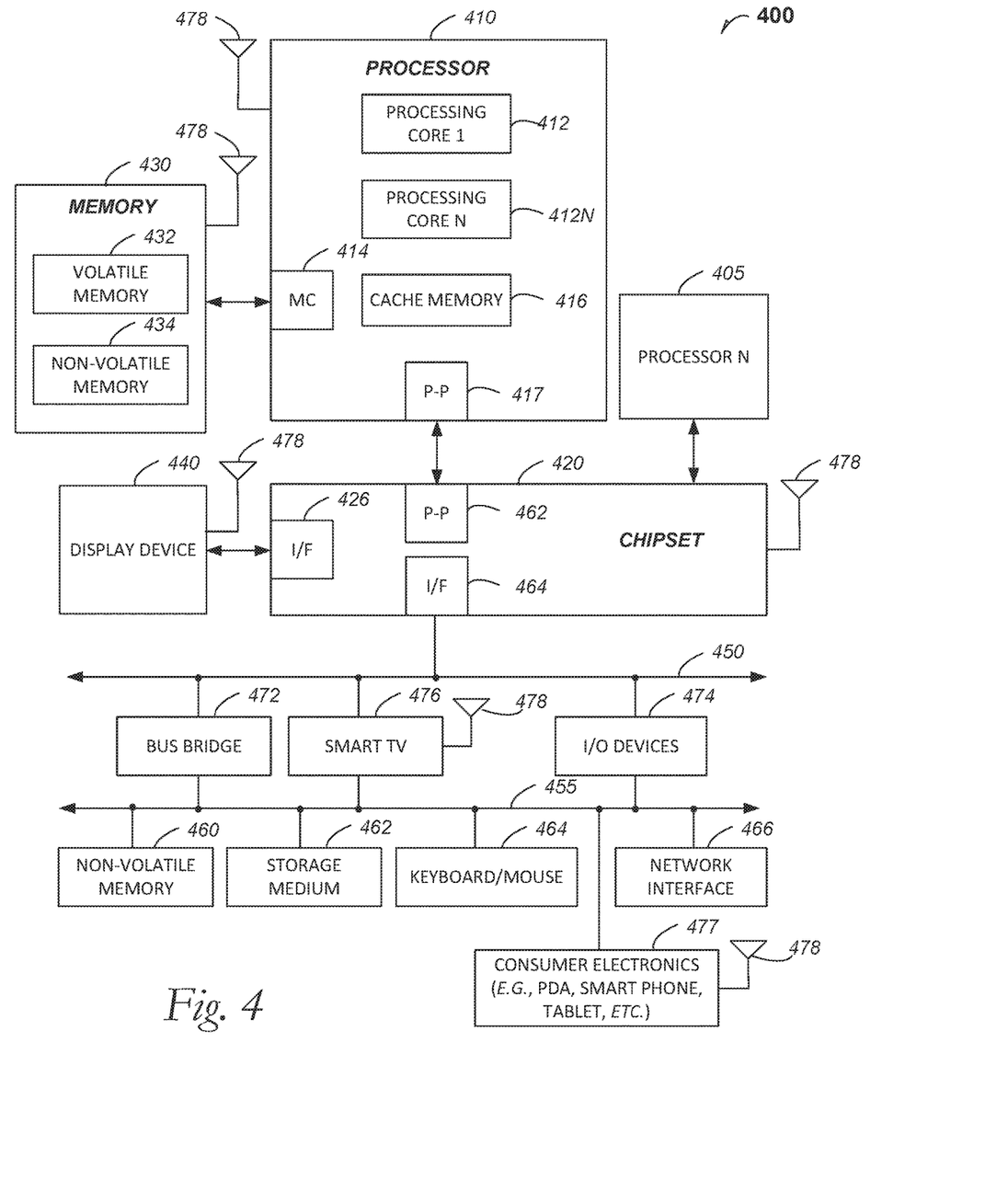
FIG. 4 is included to show an example of a higher level device application for the disclosed embodiments.

FIG. 4 is included to show an example of a higher level device application for the disclosed embodiments. The self-aligned embedded-bridge substrate connector embodiments may be found in several parts of a computing system. In an embodiment, a computing system 400 includes, but is not limited to, a desktop computer. In an embodiment, a system 400 includes, but is not limited to a laptop computer. In an embodiment, a system 400 includes, but is not limited to a netbook. In an embodiment, a system 400 includes, but is not limited to a tablet. In an embodiment, a system 400 includes, but is not limited to a notebook computer. In an embodiment, a system 400 includes, but is not limited to a personal digital assistant (PDA). In an embodiment, a system 400 includes, but is not limited to a server. In an embodiment, a system 400 includes, but is not limited to a workstation. In an embodiment, a system 400 includes, but is not limited to a cellular telephone. In an embodiment, a system 400 includes, but is not limited to a mobile computing device. In an embodiment, a system 400 includes, but is not limited to a smart phone. In an embodiment, a system 400 includes, but is not limited to an internet appliance. Other types of computing device may be configured with the microelectronic device that includes an embedded-bridge substrate connector apparatus embodiment.

In an embodiment, the processor 410 has one or more processing cores 412 and 412N, where 412N represents the Nth processor core inside processor 410 where N is a positive integer. In an embodiment, the electronic device system 400 using an embedded-bridge substrate connector embodiment that includes multiple processors including 410 and 405, where the processor 405 has logic similar or identical to the logic of the processor 410. In an embodiment, the processing core 412 includes, but is not limited to, pre-fetch logic to fetch instructions, decode logic to decode the instructions, execution logic to execute instructions and the like. In an embodiment, the processor 410 has a cache memory 416 to cache at least one of instructions and data for the power mesh-on-die apparatus in the system 400. The cache memory 416 may be organized into a hierarchal structure including one or more levels of cache memory.

In an embodiment, the processor 410 includes a memory controller 414, which is operable to perform functions that enable the processor 410 to access and communicate with memory 430 that includes at least one of a volatile memory 432 and a non-volatile memory 434. In an embodiment, the processor 410 is coupled with memory 430 and chipset 420. The processor 410 may also be coupled to a wireless antenna 478 to communicate with any device configured to at least one of transmit and receive wireless signals. In an embodiment, the wireless antenna interface 478 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 includes, but is not limited to, flash memory, phase change memory (PCM), read-only memory (ROM), electrically erasable programmable read-only memory (EEPROM), or any other type of non-volatile memory device.

The memory 430 stores information and instructions to be executed by the processor 410. In an embodiment, the memory 430 may also store temporary variables or other intermediate information while the processor 410 is executing instructions. In the illustrated embodiment, the chipset 420 connects with processor 410 via Point-to-Point (PtP or P-P) interfaces 417 and 422. Either of these PtP embodiments may be achieved using an embedded-bridge substrate connector apparatus embodiment as set forth in this disclosure. The chipset 420 enables the processor 410 to connect to other elements in the embedded-bridge substrate connector apparatus in a system 400. In an embodiment, interfaces 417 and 422 operate in accordance with a PtP communication protocol such as the Intel® QuickPath Interconnect (QPI) or like. In other embodiments, a different interconnect may be used.

In an embodiment, the chipset 420 is operable to communicate with the processor 410, 405N, the display device 440, and other devices 472, 476, 474, 460, 462, 464, 466, 477, etc. The chipset 420 may also be coupled to a wireless antenna 478 to communicate with any device configured to at least do one of transmit and receive wireless signals.

The chipset 420 connects to the display device 440 via the interface 426. The display 440 may be, for example, a liquid crystal display (LCD), a plasma display, cathode ray tube (CRT) display, or any other form of visual display device. In and embodiment, the processor 410 and the chipset 420 are merged into an embedded-bridge substrate connector apparatus in a system. Additionally, the chipset 420 connects to one or more buses 450 and 455 that interconnect various elements 474, 460, 462, 464, and 466. Buses 450 and 455 may be interconnected together via a bus bridge 472 such as at least one embedded-bridge substrate connector apparatus embodiment. In an embodiment, the chipset 420 couples with a non-volatile memory 460, a mass storage device(s) 462, a keyboard/mouse 464, and a network interface 466 by way of at least one of the interface 424 and 474, the smart TV 476, and the consumer electronics 477, etc.

In and embodiment, the mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the embedded-bridge substrate connector apparatus embodiment in a computing system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into the processor core 412.

Where useful, the computing system 400 may have an outer shell such as the outer shell 164 depicted in FIG. 2. In an embodiment, an outer shell is an electrically insulated structure that also provides physical protection for the embedded-bridge substrate connector apparatus embodiment.

To illustrate the embedded-bridge substrate connector apparatus embodiments and methods disclosed herein, a non-limiting list of examples is provided herein:

Example 1 is an embedded-bridge substrate connector apparatus comprising: a patterned reference layer coupled to a die-side module, the die-side module including a first device and a subsequent device encapsulated in the die-side module, wherein each of the first device and the subsequent device is electrically coupled to the patterned reference layer; a land-side module coupled to the die-side module including a land-side device encapsulated in the land-side module and wherein the land-side device is electrically coupled to the first device through the reference layer; and wherein one of the first device and the first land-side device is a silicon bridge for electrically communicating through the patterned reference layer between an adjacent device in one or the other of the die-side module and the land-side module.

In Example 2, the subject matter of Example 1 optionally includes a third device adjacent the first device, wherein the third device is electrically coupled to the reference layer, and wherein the first land-side device physically and communicatively bridges between the first device and the third device.

In Example 3, the subject matter of any one or more of Examples 1-2 optionally include a third device adjacent the first device, wherein the third device is electrically coupled to the reference layer, and wherein the first land-side device physically and communicatively bridges between the first device and the third device; and a second device opposite the third device and adjacent the first device, wherein the second device is electrically coupled through the reference layer to a first printed wiring board in the land-side module.

In Example 4, the subject matter of any one or more of Examples 1-3 optionally include a third device adjacent the first device, wherein the third device is electrically coupled to the reference layer, and wherein the first land-side device physically and communicatively bridges between the first device and the third device; a second device opposite the third device and adjacent the first device, wherein the second device is electrically coupled through the reference layer to a first printed wiring board in the land-side module; and wherein the subsequent device is coupled through the reference layer to a subsequent printed wiring board in the land-side module.

In Example 5, the subject matter of any one or more of Examples 1-4 optionally include a third device adjacent the first device, wherein the third device is electrically coupled to the reference layer, and wherein the first land-side device physically and communicatively bridges between the first device and the third device; a second device opposite the third device and adjacent the first device, wherein the second device is electrically coupled through the reference layer to a first printed wiring board in the land-side module; wherein the subsequent device is coupled through the reference layer to a subsequent printed wiring board in the land-side module; and a board coupled to the first printed wiring board through a land-side ball array.

In Example 6, the subject matter of any one or more of Examples 1-5 optionally include a third device adjacent the first device, wherein the third device is electrically coupled to the reference layer, and wherein the first land-side device physically and communicatively bridges between the first device and the third device; a second device opposite the third device and adjacent the first device, wherein the second device is electrically coupled through the reference layer to a first printed wiring board in the land-side module; wherein the subsequent device is coupled through the reference layer to a subsequent printed wiring board in the land-side module; a board coupled to the first printed wiring board through a land-side ball array; and a user interface coupled to the die-side module and electrically coupled to the board by a through-mold via.

In Example 7, the subject matter of Example 6 optionally includes wherein the first printed wiring board and the subsequent printed wiring board are integral parts of the open-frame structure.

In Example 8, the subject matter of any one or more of Examples 2-7 optionally include a second device adjacent the first device, wherein the second device is coupled through the reference layer to a first printed wiring board in the land-side module; and a second land-side device in the land-side module, wherein the second land-side device is coupled through the patterned reference layer to the die-side module.

In Example 9, the subject matter of any one or more of Examples 2-8 optionally include a second device adjacent the first device, wherein the second device is coupled through the reference layer to a first printed wiring board in the land-side module; a third device adjacent the first device, wherein the third device is electrically coupled to the reference layer, and wherein the first land-side device is physically and communicatively bridges between the first device and the third device; and a second land-side device in the land-side module, wherein the second land-side device is coupled through the patterned reference layer to the third device.

In Example 10, the subject matter of any one or more of Examples 2-9 optionally include a third device adjacent the first device, wherein the third device is electrically coupled to the reference layer, and wherein the first land-side device is physically and communicatively bridges between the first device and the third device; a fourth device adjacent the third device, wherein the fourth device is electrically coupled to the reference layer; and a second land-side device in the land-side module, wherein the second land-side device is coupled through the patterned reference layer to the third device and to the fourth device.

In Example 11, the subject matter of any one or more of Examples 2-10 optionally include a third device adjacent the first device, wherein the third device is electrically coupled to the reference layer, and wherein the first land-side device is physically and communicatively bridges between the first device and the third device; a fourth device adjacent the third device, wherein the fourth device is electrically coupled to the reference layer; a second land-side device in the land-side module, wherein the second land-side device is coupled through the patterned reference layer to the third device and to the fourth device; and a third land-side device disposed in the land-side module and coupled through the patterned reference layer to the fourth device, wherein the fourth device overlaps the third land-side device.

Example 12 is a method of assembling an embedded-bridge substrate connector apparatus, comprising: patterning a mask onto a conductive foil that is mounted on a carrier; plating a reference layer through a corridor in the mask and on the conductive foil; attaching a first semiconductive device to the reference layer at a ball array; encapsulating the first semiconductive device, both above the device and underfilling the device at the ball array and reference layer, to achieve a die-side module; attaching a land-side first device to the first device in the die-side module; and encapsulating the first land-side device to achieve a land-side module.

In Example 13, the subject matter of Example 12 optionally includes removing the mask before attaching the first semiconductive device.

In Example 14, the subject matter of any one or more of Examples 12-13 optionally include removing the mask; attaching the first device; and attaching a subsequent device to the reference layer.

In Example 15, the subject matter of any one or more of Examples 12-14 optionally include removing the mask; attaching the first device; attaching a subsequent device to the reference layer; and attaching a third device to the reference layer, wherein the first land-side device physically and communicatively bridges between the first device and the third device.

In Example 16, the subject matter of any one or more of Examples 12-15 optionally include attaching a first printed wiring board to the die-side module by coupling to the first device.

In Example 17, the subject matter of any one or more of Examples 12-16 optionally include attaching a first printed wiring board to the die-side module by coupling to the first device; and attaching a subsequent printed wiring board to the die-side module by coupling to the subsequent device.

In Example 18, the subject matter of any one or more of Examples 12-17 optionally include attaching a first printed wiring board to the die-side module by coupling to the first device; and attaching the land-side module to a board through a land-side ball array.

Example 19 is a computing system containing an embedded-bridge substrate connector apparatus comprising: a patterned reference layer coupled to a die-side module, the die-side module including a first device and a subsequent device encapsulated in the die-side module, wherein each of the first device and the subsequent device is electrically coupled to the patterned reference layer; a land-side module coupled to the die-side module including a land-side device encapsulated in the land-side module and wherein the land-side device is electrically coupled to the first device through the reference layer; wherein one of the first device and the first land-side device is a silicon bridge for electrically communicating through the patterned reference layer between an adjacent device in one or the other of the die-side module and the land-side module; and a board coupled to the land-side module, wherein the board includes an electrically insulated outer shell for the computing system.

In Example 20, the subject matter of Example 19 optionally includes a user interface that includes a touch-sensitive display.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An embedded-bridge substrate connector apparatus comprising:
    a patterned reference layer including a die side and a land side, wherein the patterned reference layer is embedded in and each portion of the patterned reference layer is exposed by a die-side encapsulation, wherein the patterned reference layer is coupled to a die-side module, the die-side module including a first device and a subsequent device encapsulated in the die-side encapsulation, wherein each of the first device and the subsequent device is electrically coupled to the patterned reference layer;
    a land-side module coupled to the die-side module including a first land-side device encapsulated in a land-side encapsulation and wherein the first land-side device is electrically coupled to the first device through the patterned reference layer, wherein the patterned reference layer is contacted by electrical bumps on the die side and by electrical bumps on the land side, wherein a first one of the electrical bumps contacts a patterned reference layer element and the first device, and wherein a second one of the electrical bumps contacts the patterned reference layer element and the first land-side device; and
    wherein one of the first device and the first land-side device is a silicon bridge for electrically communicating through the patterned reference layer between an adjacent device in one or the other of the die-side module and the land-side module.

2. The embedded-bridge substrate connector apparatus of claim 1, further including:
    a third device adjacent the first device, wherein the third device is electrically coupled to the patterned reference layer, and wherein the first land-side device physically and communicatively bridges between the first device and the third device.

3. The embedded-bridge substrate connector apparatus of claim 2, further including:
    a second device adjacent the first device, wherein the second device is coupled through the patterned reference layer to a first printed wiring board in the land-side module; and
    a second land-side device in the land-side module, wherein the second land-side device is coupled through the patterned reference layer to the die-side module.

4. The embedded-bridge substrate connector apparatus of claim 2, further including:
    a second device adjacent the first device, wherein the second device is coupled through the patterned reference layer to a first printed wiring board in the land-side module;
    and
    a second land-side device in the land-side module, wherein the second land-side device is coupled through the patterned reference layer to the third device.

5. The embedded-bridge substrate connector apparatus of claim 2, further including:
    a fourth device adjacent the third device, wherein the fourth device is electrically coupled to the patterned reference layer; and
    a second land-side device in the land-side module, wherein the second land-side device is coupled through the patterned reference layer to the third device and to the fourth device.

6. The embedded-bridge substrate connector apparatus of claim 2, further including:
    a fourth device adjacent the third device, wherein the fourth device is electrically coupled to the patterned reference layer;
    a second land-side device in the land-side module, wherein the second land-side device is coupled through the patterned reference layer to the third device and to the fourth device; and
    a third land-side device disposed in the land-side module and coupled through the patterned reference layer to the fourth device, wherein the fourth device overlaps the third land-side device.

7. The embedded-bridge substrate connector apparatus of claim 1, further including:
    a third device adjacent the first device, wherein the third device is electrically coupled to the patterned reference layer, and wherein the first land-side device physically and communicatively bridges between the first device and the third device; and
    a second device opposite the third device and adjacent the first device, wherein the second device is electrically coupled through the patterned reference layer to a first printed wiring board in the land-side module.

8. The embedded-bridge substrate connector apparatus of claim 1, further including:
    a third device adjacent the first device, wherein the third device is electrically coupled to the patterned reference layer, and wherein the first land-side device physically and communicatively bridges between the first device and the third device;
    a second device opposite the third device and adjacent the first device, wherein the second device is electrically coupled through the patterned reference layer to a first printed wiring board in the land-side module; and
    wherein the subsequent device is coupled through the patterned reference layer to a subsequent printed wiring board in the land-side module.

9. The embedded-bridge substrate connector apparatus of claim 1, further including:

a third device adjacent the first device, wherein the third device is electrically coupled to the patterned reference layer, and wherein the first land-side device physically and communicatively bridges between the first device and the third device;

a second device opposite the third device and adjacent the first device, wherein the second device is electrically coupled through the patterned reference layer to a first printed wiring board in the land-side module;

wherein the subsequent device is coupled through the patterned reference layer to a subsequent printed wiring board in the land-side module; and a board coupled to the first printed wiring board through a land-side ball array.

10. The embedded-bridge substrate connector apparatus of claim 1, further including:

a third device adjacent the first device, wherein the third device is electrically coupled to the patterned reference layer, and wherein the first land-side device physically and communicatively bridges between the first device and the third device;

a second device opposite the third device and adjacent the first device, wherein the second device is electrically coupled through the patterned reference layer to a first printed wiring board in the land-side module;

wherein the subsequent device is coupled through the patterned reference layer to a subsequent printed wiring board in the land-side module;

a board coupled to the first printed wiring board through a land-side ball array; and a user interface coupled to the die-side module and electrically coupled to the board by a through-mold via.

11. The embedded-bridge substrate connector apparatus of claim 10, wherein the first printed wiring board and the subsequent printed wiring board are integral parts of an open-frame structure.

12. The embedded-bridge substrate connector apparatus of claim 1, wherein the electrical bumps on the die side are part of a ball-grid array, and wherein the electrical bumps on the land side are part of a ball-grid array.

13. A computing system containing an embedded-bridge substrate connector apparatus comprising:

a patterned reference layer including a land side and a die side, embedded in and each portion of the patterned reference layer is exposed by a die-side encapsulation, wherein the patterned reference layer is coupled to a die-side module, the die-side module including a first device and a subsequent device encapsulated in the die-side encapsulation, wherein each of the first device and the subsequent device is electrically coupled to the patterned reference layer;

a land-side module coupled to the die-side module including a first land-side device encapsulated in a land-side encapsulation and wherein the first land-side device is electrically coupled to the first device through the patterned reference layer, wherein the patterned reference layer is contacted by electrical bumps on the die side and by electrical bumps on the land side, wherein a first one of the electrical bumps contacts a patterned reference layer element and the first device, and wherein a second one of the electrical bumps contacts the patterned reference layer element and the first land-side device;

wherein one of the first device and the first land-side device is a silicon bridge for electrically communicating through the patterned reference layer between an adjacent device in one or the other of the die-side module and the land-side module; and a board coupled to the land-side module, wherein the board includes an electrically insulated outer shell for the computing system.

14. The computing system of claim 13, further including a user interface disposed on the die-side module that includes a touch-sensitive display.

15. The computing system of claim 13, wherein the electrical bumps on the die side are part of a ball-grid array, and wherein the electrical bumps on the land side are part of a ball-grid array.

16. An embedded-bridge substrate connector apparatus comprising:

a patterned reference layer including a land side and a die side, embedded in and exposed by a die-side encapsulation, wherein the patterned reference layer is coupled to a die-side module, the die-side module including a first device and a subsequent device in the die-side encapsulation, wherein each of the first device and the subsequent device is electrically coupled to the patterned reference layer;

a land-side module coupled to the die-side module including a first land-side device encapsulated in a land-side encapsulation and wherein the first land-side device is electrically coupled to the first device through the patterned reference layer, and wherein the first device is coupled to a first printed wiring board in the land-side module, wherein the patterned reference layer is contacted by electrical bumps on the die side and by electrical bumps on the land side, wherein a first one of the electrical bumps contacts a patterned reference layer element and the first device, and wherein a second one of the electrical bumps contacts the patterned reference layer element and the first land-side device;

wherein the first land-side device is a silicon bridge for electrically communicating through the patterned reference layer between an adjacent device in one or the other of the die-side module and the land-side module;

a subsequent printed wiring board disposed in the land-side module, wherein the subsequent device is coupled through the patterned reference layer to the subsequent printed wiring board; and a third device adjacent the first device, wherein the third device is electrically coupled to the patterned reference layer, and wherein the first land-side device physically and communicatively bridges between the first device and the third device.

17. The embedded-bridge substrate connector apparatus of claim 16, further including:

a second device adjacent the first device, wherein the second device is coupled through the patterned reference layer to the first printed wiring board in the land-side module; and a second land-side device in the land-side module, wherein the second land-side device is coupled through the patterned reference layer to the die-side module.

18. The embedded-bridge substrate connector apparatus of claim 16, further including a second land-side device in the land-side encapsulation, wherein the second land-side device is coupled through the patterned reference layer to the third device.

19. The embedded-bridge substrate connector apparatus of claim 16, further including:

a fourth device adjacent the third device, wherein the fourth device is electrically coupled to the patterned reference layer; and a second land-side device in the land-side encapsulation, wherein the second land-side device is coupled through the patterned reference layer to the third device and to the fourth device.

20. The embedded-bridge substrate connector apparatus of claim 16, further including:
a fourth device adjacent the third device, wherein the fourth device is electrically coupled to the patterned reference layer;
a second land-side device in the land-side encapsulation, wherein the second land-side device is coupled through the patterned reference layer to the third device and to the fourth device; and
a third land-side device disposed in the land-side encapsulation and coupled through the patterned reference layer to the fourth device, wherein the fourth device overlaps the third land-side device.

21. The embedded-bridge substrate connector apparatus of claim 16, further including:
a fourth device adjacent the third device, wherein the fourth device is electrically coupled to the patterned reference layer;
a second land-side device in the land-side module, wherein the second land-side device is coupled through the patterned reference layer to the third device and to the fourth device;
a third land-side device disposed in the land-side module and coupled through the patterned reference layer to the fourth device, wherein the fourth device overlaps the third land-side device; and
a board coupled to the first printed wiring board through a land-side ball array on the first printed wiring board.

22. The embedded-bridge substrate connector apparatus of claim 16, further including:
a fourth device adjacent the third device, wherein the fourth device is electrically coupled to the patterned reference layer;
a second land-side device in the land-side encapsulation, wherein the second land-side device is coupled through the patterned reference layer to the third device and to the fourth device;
a third land-side device disposed in the land-side encapsulation and coupled through the patterned reference layer to the fourth device, wherein the fourth device overlaps the third land-side device; and
a board coupled to the subsequent printed wiring board through a land-side ball array on the subsequent printed wiring board.

23. The embedded-bridge substrate connector apparatus of claim 16, wherein the electrical bumps on the die side are part of a ball-grid array, and wherein the electrical bumps on the land side are part of a ball-grid array.

* * * * *